(12) United States Patent
Maex et al.

(10) Patent No.: US 6,844,266 B2
(45) Date of Patent: Jan. 18, 2005

(54) ANISOTROPIC ETCHING OF ORGANIC-CONTAINING INSULATING LAYERS

(75) Inventors: Karen Maex, Herent (BE); Ricardo A. Donaton, Cortlandt Manor, NY (US); Michael Baklanov, Leuven (BE); Serge Vanhaelemeersch, Leuven (BE); Herbert Struyf, Kontich (BE); Marc Schaekers, Leuven (BE)

(73) Assignee: Interuniversitair Microelektronica Centrum, Leuven (BE)

( * ) Notice: Subject to any disclaimer, the term of this patent is extended or adjusted under 35 U.S.C. 154(b) by 0 days.

(21) Appl. No.: 10/388,275

(22) Filed: Mar. 12, 2003

(65) Prior Publication Data

US 2003/0162407 A1 Aug. 28, 2003

Related U.S. Application Data

(63) Continuation of application No. 09/967,848, filed on Sep. 28, 2001, now abandoned, which is a continuation-in-part of application No. 09/530,069, filed as application No. PCT/BE98/00159 on Oct. 22, 1998.
(60) Provisional application No. 60/236,569, filed on Sep. 29, 2000, provisional application No. 60/074,524, filed on Feb. 12, 1998, and provisional application No. 60/063,487, filed on Oct. 22, 1997.

(30) Foreign Application Priority Data

May 18, 1998 (EP) ............................................ 98870111

(51) Int. Cl.⁷ ............................................ H01L 21/302
(52) U.S. Cl. ...................... 438/714; 438/719; 438/725; 438/734; 134/1.2
(58) Field of Search ................................ 438/725, 719, 438/714, 734; 134/1.2

(56) References Cited

U.S. PATENT DOCUMENTS 3,816,196 A  6/1974 La Combe
4,529,475 A  7/1985 Okano et al.
4,661,204 A  4/1987 Mathur et al.

(List continued on next page.)

FOREIGN PATENT DOCUMENTS

| EP | 0 127 166 B1 | 1/1989 |
| EP | 1 037 275 | 9/2000 |
| JP | 10 012617 A2 | 1/1998 |

OTHER PUBLICATIONS

"Transformer Coupled Plasma Dielectric Etch For 0.25 Micron Technologies"; Microelectronic Engineering; (Jan. 2000); vol. 50; No. 1–4; pp 75–80; Delsol et. al.*

Primary Examiner—George A. Goudreau
(74) Attorney, Agent, or Firm—Knobbe Martens Olson & Bear LLP

(57) ABSTRACT

A method for anisotropic plasma etching of organic-containing insulating layers is disclosed. According to this method at least one opening is created in an organic-containing insulating layer formed on a substrate. These openings are created substantially without depositing etch residues by plasma etching said insulating layer in a reaction chamber containing a gaseous mixture which is composed such that the plasma etching is highly anisotropic. Examples of such gaseous mixtures are a gaseous mixture comprising a fluorine-containing gas and an inert gas, or a gaseous mixture comprising an oxygen-containing gas and an inert gas, or a gaseous mixture comprising HBr and an additive. The plasma etching of the organic-containing insulating layer can be performed using a patterned bilayer as an etch mask, said bilayer comprising a hard mask layer, being formed on said organic-containing insulating layer, and a resist layer being formed on said hard mask layer. A method is disclosed for forming a layer, protecting exposed surfaces of low-k dielectrics. More particularly the method comprises the steps of sealing exposed surfaces of a, preferably porous, low-k dielectric, by forming a protective layer on exposed surfaces during or after the step of patterning openings in the porous dielectric layers. Preferably this protective layer is formed by a N2/O2 plasma treatment of the exposed surfaces.

8 Claims, 11 Drawing Sheets

U.S. PATENT DOCUMENTS

| | | |
|---|---|---|
| 5,173,442 A | 12/1992 | Carey |
| 5,176,790 A | 1/1993 | Arleo et al. |
| 5,269,879 A | 12/1993 | Rhoades et al. |
| 5,358,902 A | 10/1994 | Verhaar et al. |
| 5,641,581 A | 6/1997 | Nishiyama et al. |
| 5,759,906 A | 6/1998 | Lou |
| 5,886,410 A * | 3/1999 | Chiang et al. ............... 257/759 |
| 5,892,286 A | 4/1999 | Toyoda et al. |
| 6,162,583 A | 12/2000 | Yang et al. |
| 6,204,168 B1 | 3/2001 | Naik et al. |
| 6,387,819 B1 | 5/2002 | Yu |
| 6,413,879 B1 | 7/2002 | Maeda |
| 6,492,276 B1 * | 12/2002 | Huang ........................ 438/700 |

* cited by examiner

FTIR spectrum of BD II low-k film.

Figure 16
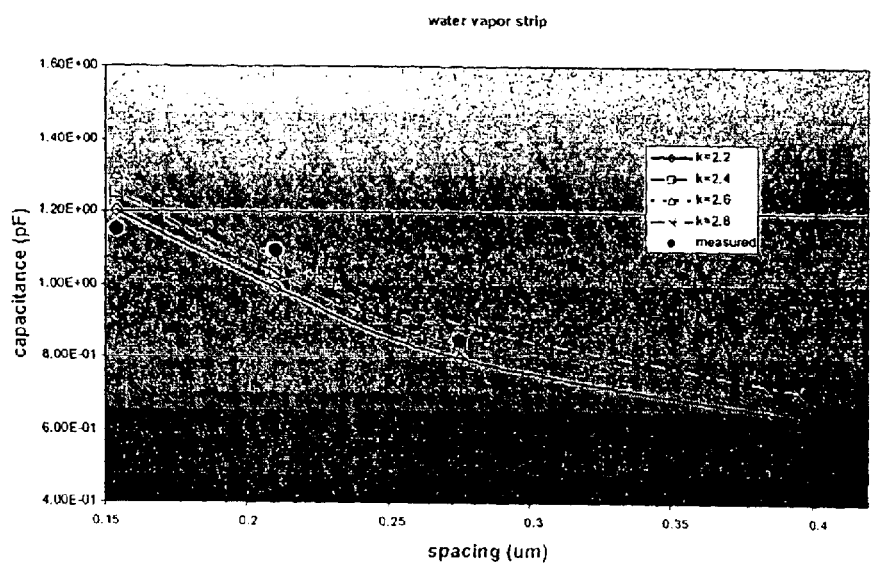
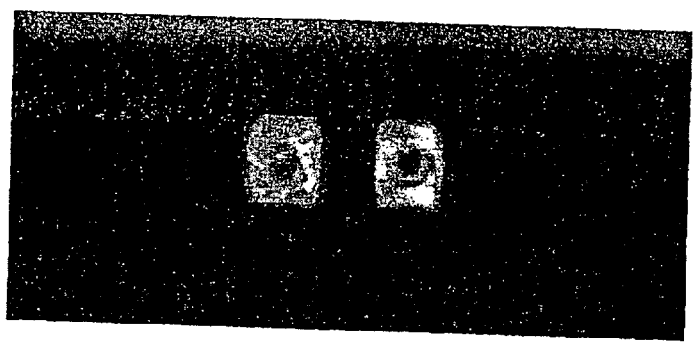

Figure 17
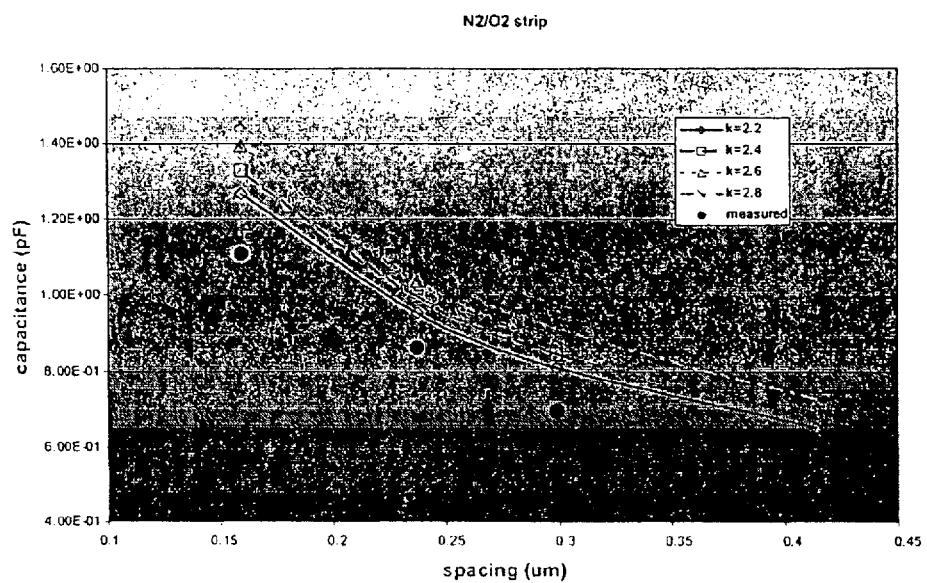
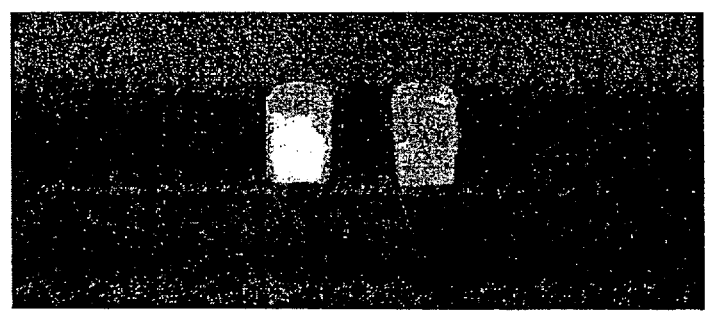

ANISOTROPIC ETCHING OF ORGANIC-CONTAINING INSULATING LAYERS

RELATED APPLICATIONS

This application claims priority under 35 U.S.C. §119(e) to U.S. provisional application Ser. No. 60/236,569 filed Sep. 29, 2000, and is a continuation of Ser. No. 09/967,848, filed Sep. 28, 2001 now abandoned, which is a continuation-in-part of Ser. No. 09/530,069, filed Jul. 3, 2000, which is the national phase under 35 U.S.C. §371 of prior PCT International Application No. PCT/BE98/00159 which has an International filing date of Oct. 22, 1998, which designates the United States of America, which was published in English by the International Bureau on Apr. 29, 1999, and which claims priority to U.S. provisional applications Ser. No. 60/063,487, filed Oct. 22, 1997 and Ser. No. 60/074,524 filed Feb. 12, 1998, the disclosures of each of which are hereby incorporated by reference in their entireties.

FIELD OF THE INVENTION

The present invention is related to the process of semiconductor device fabrication. More in particular, methods including tools and chemistries for anisotropic dry etching of low k polymers are disclosed. These etching processes can be used for definition of via holes and trenches in different interconnect architectures. These etching processes can also be used for sealing off exposed surfaces of openings defined in different interconnect architectures.

BACKGROUND OF THE INVENTION

The ongoing focus on miniaturization and the increasing complexity and speed requirements of integrated circuits demand for a continuous higher density integration. To achieve this, there is an ongoing downscaling of the dimensions of the active devices as well as of the structures interconnecting these devices. These interconnect structures can comprise multiple metal levels which are, dependent on the aimed interconnect pattern, either separated one from another by means of interlevel insulating layers or connected one to the other by means of a conductive connection through the insulating layer. Intra-level insulating layers are used to provide isolation within a metal level. Besides this downscaling of the dimensions, additional measures are required to be able to meet the stringent speed specifications like e.g. the signal delay. Conventionally the metal levels are Aluminum layers while the insulating layers are oxide layers. In order to reduce the signal delay one can choose a metal layer with a higher conductivity compared to Aluminum, e.g. a Cu-containing metal layer, and/or choose insulating layers with a lower dielectric constant compared to oxide layers.

This demand for insulating layers with a low dielectric constant has lead to an intensified search for new low K materials to be used as insulating layers. A low $\epsilon$ material, a low K material and a material with a low permittivity are all alternative expressions for a material with a low dielectric constant, at least for the purposes of this disclosure. The most desirable material should have a low K value, low mechanical stress, high thermal stability and low moisture absorption. Furthermore, the desired material should be selected based on the compatibility with state-of-the-art semiconductor processing steps and tools. Among these new materials are the organic spin-on materials, having a K value in the range from 2.5 to 3, the porous polymers, and the inorganic low-K materials as e.g. xerogels having a K value typically lower than 1.5. The organic materials are of particular interest because they feature simplified processing, excellent gap-fill and planarization.

Nowadays, there are two major ways of fabricating interconnect structures. In the conventional way as a start a conductive layer, e.g. a metal layer, is formed on an insulating layer (or on the substrate) and patterned thereafter usually by means of reactive ion etching (RIE). Another way is the damascene technology. In the damascene technology, first an insulating layer is deposited and patterned and thereafter a metal layer is deposited to fill the openings, eventually followed by a planarization step to remove the metal excess. The damascene technology has the additional advantage that the difficult metal RIE step is avoided. Damascene processing reduces the problem to dry etching of an insulating layer or a stack of insulating layers. This technique allows the build up of horizontal metal patterns as well as vertical metal connections in the surrounding insulating layers. These vertical metal connections are required in order to be able to provide a conductive connection between two horizontal metal patterns being processed in different metal levels. To provide such a connection, usually first openings have to be formed in the insulating layer or in the stack of insulating layers between two different metal levels and filled thereafter with a conductive material. Examples of such openings are via holes or contact holes or trenches. To meet the high density integration requirements, the diameter of these openings is continuously decreasing, while at the same time the aspect ratio of these openings is increasing. Due to the small diameter and the high aspect ratios, the creation of these openings, especially the lithographic steps and the etching steps involved, is a critical process. Therefore, etching of polymers used as insulating layers requires highly anisotropic etching capabilities.

U.S. Pat. No. 5,269,879 is related to the etching of silicon oxide, silicon nitride or oxynitride layers in order to create a via hole extending through such a layer to an underlying electrically conductive layer. Particularly plasma etching is disclosed in an ambient including a fluorine-containing gas, a small amount of a passivating gas, i.e. nitrogen, and eventually an inert gas. This passivating gas is added to the plasma to prevent the sputtering of the underlying electrically conductive layer.

U.S. Pat. No. 5,176,790 is related to the etching of mainly silicon oxide, silicon nitride or oxynitride layers in order to create a via hole extending through such a layer to an underlying electrically conductive layer. Particularly plasma etching is disclosed in an ambient including a fluorine-containing gas, a nitrogen-containing gas, and eventually an inert gas. This nitrogen-containing gas is added to the plasma to prevent the sputtering of the underlying electrically conductive layer. However the amount of nitrogen-containing gas in the ambient is limited. This amount ranges from 1 volume part of nitrogen-containing gas per 2 volume parts of fluorine-containing gas to 1 volume part of nitrogen-containing gas per 15 volume parts of fluorine-containing gas.

SUMMARY OF THE INVENTION

Etching of insulating layers in semiconductor processing requires highly anisotropic etching capabilities in order to be able to create sub 0.5 $\mu$m openings such as via holes, trenches and contact holes. A method is disclosed for forming at least one opening in an organic-containing insulating layer formed on a substrate. Preferably, this organic-containing insulating layer comprises at least one unsaturated carbon bond. Examples of organic-containing insulating layer comprising at least one unsaturated carbon bond are organic-containing insulating layers comprising at least one phenyl group. Typical examples are the benzocyclobutarenes, poly arylene ether, aromatic hydrocarbon, and polyimides. These openings are created substantially without depositing etch residues on the exposed layers by plasma etching said insulating layer in a reaction chamber containing a gaseous mixture, said gaseous mixture comprising a fluorine-containing gas and an inert gas. Substantially without etch residues means that a limited amount of etch residues can be formed on the exposed layers but that their composition is such that they can easily be removed selective to the organic-containing insulating layer after the openings have been created in subsequent etch or cleaning steps and that they do not affect the anisotropy of the plasma etching. While the plasma etching proceeds, the process conditions are such that the side walls of the openings are fluorinated which advantageously affects the anisotropy of said plasma etching. To obtain anisotropic plasma etching, preferably the spontaneous etching is negligible, while the etch reaction is effectively stimulated by ion bombardment. In other words, the lateral etch rate should be negligible small compared to the vertical etch rate. Particularly by exposing the side walls of the openings to the fluorine-containing gaseous mixture, the chemical composition of the organic-containing insulating layer at the side walls of the openings is modified. This modification results in an increase of the chemical resistance of the fluorinated part of the organic-containing insulating layer, i.e. at the side walls of the openings thereby enhancing the anisotropy of the plasma etching. Plasma etching includes plasma-assisted dry etching as well as reactive ion etching (RIE). The plasma etching of the organic-containing insulating layer can be performed using a patterned bilayer as an etch mask, said bilayer comprising a resist hard mask layer, being formed on said organic-containing insulating layer, and a resist layer being formed on said resist hard mask layer. Particularly, said resist hard mask layer is a silicon oxide, or a silicon nitride, or a silicon oxynitride layer, or a silicon carbide layer, or a silicon oxycarbide layer. For the purpose of this disclosure a resist hard mask layer is a layer being used as an etch mask layer or an etch stop layer to selectively remove a resist layer. The plasma etching is preferably but not necessarily selective to said resist hard mask layer. The process conditions are such that a highly anisotropic plasma etch is performed featuring substantially no undercut of the hard mask layer and substantially with the conservation of the original hard mask profile.

In an embodiment, the openings created in the organic-containing insulating layers comprise at least one via hole, said via hole extending through said insulating layer to an underlying conductive layer or a barrier layer. The plasma etching method of the preferred embodiments is selective to this underlying layer. In other words excess removal of this underlying layer is prevented. This underlying conductive and/or barrier layer can be a layer of Ti, TiN, Ta, TaN, Co, silicon nitride, silicon carbide, silicon oxycarbide, Pt, W, Al, Cu or an alloy of Al or Cu, or any other low resistivity material.

In another embodiment, the plasma etching method removes the resist layer during the creation of the openings in the organic-containing insulating layers. However in this case, the resist hard mask layer has to be a hard mask layer. For the purpose of this disclosure, a hard mask layer is defined as a layer which can be etched selective to the underlying layer, i.e. the organic-containing insulating layer. By doing so, a resist strip after the openings have been created is avoided. Therefore the thickness of the resist layer has to be chosen in accordance with the precise etch conditions and the thickness of the insulating layer. Particularly, this is important when the organic containing insulating layers are silicon-free layers because these silicon-free layers are very sensitive for subsequent etch steps or cleaning steps.

Yet in another embodiment, the plasma etching method only partly removes the resist layer during the creation of the openings in the organic-containing insulating layers. The thickness of the resist layer is chosen in accordance with the precise etch conditions and the thickness of the organic-containing insulating layer and such that there is still some resist left-over when the openings are created. Afterwards the left-over resist is removed e.g. using a solvent stripper, or an oxygen-containing plasma, or a combination thereof. Particularly this oxygen-containing plasma can be an oxygen plasma. This resist removal can be done substantially without consequences for the side walls of the organic-containing insulating layer at the openings provided that said polymer layer is not too sensitive for said oxygen-containing plasma. A typical example of such a layer which is not too sensitive for an oxygen-containing plasma is a layer selected from the group of the benzocyclobutarenes.

In a further embodiment, the gaseous mixture in the reaction chamber further comprises an oxygen-containing gas. Examples of such an oxygen-containing gas are $O_2$, CO, $CO_2$ and $SO_2$, but the preferred embodiments are not limited thereto. By the addition of a small amount of oxygen to the gaseous mixture, the etch rate is increased.

In still a further embodiment, a method is disclosed for forming at least one opening in an organic-containing insulating layer formed on a substrate. These openings are created substantially without depositing etch residues by plasma etching said insulating layer in a reaction chamber containing a gaseous mixture, said gaseous mixture comprising a fluorine-containing gas. So no inert gas is present in said gaseous mixture.

In a second aspect of the preferred embodiments, a method is disclosed for forming at least one opening in an organic-containing insulating layer formed on a substrate. These openings are created by plasma etching said insulating layer in a reaction chamber containing a gaseous mixture, said gaseous mixture comprising an oxygen-containing gas and an inert gas. The ratio between said oxygen-containing gas and said inert gas in said gaseous mixture is chosen such that the spontaneous etch rate is substantially zero. So the use of fluorine is avoided which can be beneficial for further processing because amongst other things, fluorine is known to stimulate corrosion, e.g. especially for Cu this can be an issue.

The plasma etching of the organic-containing insulating layer, according to the preferred embodiment, can be performed using a patterned bilayer as an etch mask, said bilayer comprising a hard mask layer, being formed on said organic-containing insulating layer, and a resist layer being formed on said hard mask layer. The plasma etching method has a high selectivity to the hard mask layer formed on the polymer layer. The plasma etch process creates openings in the organic-containing insulating layer and simultaneously selectively removes the resist layer thereby avoiding a resist strip after etching. Preferably, this organic-containing insulating layer is an organic polymer layer with a low K value. Particularly, this organic-containing insulating layer can be a silicon-free polymer layer.

In a preferred embodiment, the oxygen-containing gas in the gaseous mixture is $O_2$ and the inert gas in the gaseous mixture is nitrogen. The ratio of the amount of nitrogen in said gaseous mixture to the amount of oxygen in said gaseous mixture is preferably in the range from about 10:1 to about 2:1, or from about 30:1 to about 1:1, or from about 50:1 to about 1:1.

In another embodiment, a two-step anisotropic etch process is disclosed, wherein in a first step a first part of an opening is created by means of anisotropic plasma etching using a gaseous mixture comprising a fluorine-containing gas and an inert gas, while in a second step the second part of said opening is etched by means of anisotropic plasma etching using a gaseous mixture comprising an oxygen-containing gas and an inert gas to thereby complete said opening and simultaneously selectively remove the resist.

In another embodiment, a layer is deposited on the surfaces of the organic-containing insulating layer or low-k dielectric exposed an plasma using a gaseous mixture comprising a fluorine-containing gas and an inert gas. These surfaces can be the sidewalls of an opening formed in this organic-containing insulating layer. This layer seals the surfaces of the organic-containing insulating layer exposed the plasma. This sealing or protective layer can be formed during the step of defining the openings in said organic-containing insulating layer in a single or in a two step sequence. This sealing or protective layer can be formed during the step of removing the patterned resist layer. The preferred embodiments provide a method for maintaining or conserving the dielectric constant of as-deposited or modified low-k films by sealing at least the exposed parts of the structure of those films during or after the patterning of the features, the dielectric constant being preserved with respect to its as-deposited or modified value.

In a third aspect of the preferred embodiments, a method is disclosed for forming at least one opening in an organic-containing insulating layer formed on a substrate. These openings are created by plasma etching said insulating layer in a reaction chamber containing a gaseous mixture, said gaseous mixture comprising HBr and an additive, said additive passivating the exposed parts of the insulating layer, i.e. the side walls. Typical examples of such an additive are an inert gas, like $N_2$, Ar, He, Xe, Krypton or an oxygen-containing gas, like $O_2$, CO, $CO_2$, $N_2O$, $NO_2$, $SO_2$, but the preferred embodiments are not limited thereto. Preferably, this organic-containing insulating layer is an organic polymer layer with a low K value.

BRIEF DESCRIPTION OF THE DRAWINGS

FIG. 16 represents interline capacitance measured at 100 kHz and simulated for different line spacing after single damascene process, using the water vapor strip process. The solid lines represent simulation results with different dielectric constant values. Below, FIB image of the interline capacitance structure (nominal 0.25/0.25 μm line/space). Due to the poor contrast between the Pt (FIB preparation) and SiC, the top hard mask cannot be clearly seen in this image.

FIG. 17 represents an interline capacitance measured at 100 kHz and simulated for different line spacing after single damascene process, using the $N_2/O_2$ in situ strip process, according to a second aspect of a preferred embodiment. The solid lines represent simulation results with different dielectric constant values. Below, FIB image of the interline capacitance structure (nominal 0.25/0.25 μm line/space).

Figure 1:
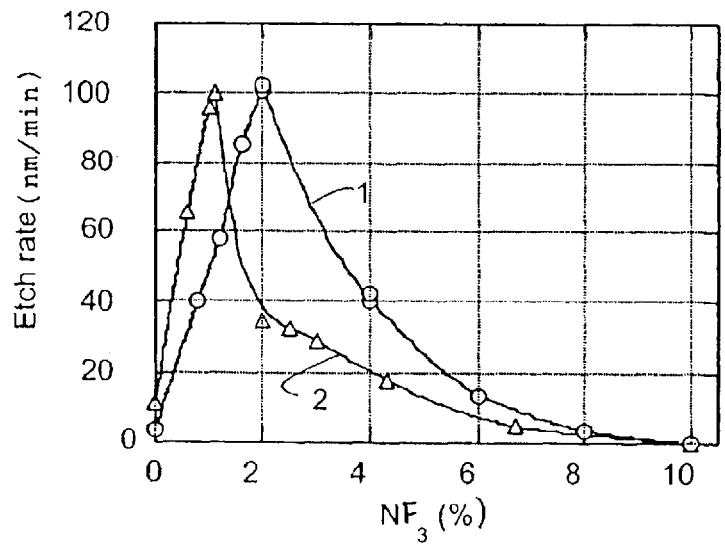
FIG. 1 represents afterglow etch rates of planar SiLK (2) and BCB (1) layers for different $NF_3/O_2$ flow ratios.

Due to the poor contrast between the Pt (FIB preparation) and SiC, the top hard mask cannot be clearly seen in this image.

DETAILED DESCRIPTION OF THE PREFERRED EMBODIMENT

In relation to the appended drawings the present invention is described in detail in the sequel. It is apparent however that a person skilled in the art can imagine several other equivalent embodiments or other ways of executing the present invention, the spirit and scope of the present invention being limited only by the terms of the appended claims.

In a first aspect of a preferred embodiment, a method is disclosed for forming at least one opening in an organic-containing insulating layer formed on a substrate. These openings are created substantially without depositing etch residues by plasma etching said insulating layer in a reaction chamber containing a gaseous mixture, said gaseous mixture comprising a fluorine-containing gas and an inert gas. Preferably, this organic-containing insulating layer comprises at least one unsaturated carbon bond. Examples of organic-containing insulating layer comprising at least one unsaturated carbon bond are organic-containing insulating layers comprising at least one phenyl group. Typical examples are the benzocyclobutarenes, e.g. Cyclotene 5021™ from Dow Chemical with chemical formulation divinyl siloxane benzocyclobutane (BCB), poly arylene ether, e.g. FLARE™ II, aromatic hydrocarbon, e.g. SILK™. The substrate can be a partly processed or a pristine wafer or slice of a semi-conductive material, like Si or Ga As or Ge, or an insulating material, e.g. a glass slice, or a conductive material. Said substrate can comprise a patterned conductive layer. Particularly, in case said substrate is a partly processed wafer or slice; at least a part of the active and/or passive devices can already be formed and/or at least a part of the structures interconnecting these devices can be formed.

To obtain anisotropic plasma etching, preferably the spontaneous etching is limited or negligible, while the etch reaction is effectively stimulated by ion bombardment. In other words, the lateral etch rate should be negligible small compared to the vertical etch rate. Particularly by exposing the side walls of the openings, i.e. the surface of the organic-containing insulating layer comprising at least one phenyl group at these side walls of these openings, to the fluorine-containing gaseous mixture during the plasma etching, these side walls are fluorinated which advantageously affects the anisotropy of said plasma etching. By doing so, the chemical composition of the organic-containing insulating layer comprising at least one unsaturated carbon bond is modified at the side walls of the openings. Particularly, organic-containing insulating layers comprising phenyl groups contain such unsaturated carbon bonds. These carbon bonds, which can be attacked by reactive species such as atomic fluorine generated in a plasma or another ambient comprising active fluorine. Said active fluorine can abstract hydrogen from carbon in said phenyl groups. Therefore, the method involves a formal replacement of hydrogen by fluorine. Furthermore, due to the small size of the fluorine atoms, they can easily diffuse through the insulating layer. Consequently the replacement of hydrogen by fluorine is not limited to the surface of the layer but can extend also further in the layer. Fluorine is the most electronegative and the least polarizable element on the periodic table. The incorporation of fluorine in the insulating layer at the side walls of the openings makes the fluorinated part of the insulating layer less polarizable leading to an increase in chemical resistance and a decrease of the K value of said part, said part starts at a surface and extends in the insulating layer with elapsing exposure time. So particularly, this in-situ fluorination results in an increase of the chemical resistance of the fluorinated part of the organic-containing insulating layer, i.e. at the side walls of the openings thereby enhancing the anisotropy of the plasma etching. It should be clear however that during the plasma etching the bottom side of the openings, i.e. a surface of the insulating layer at the etch front of the opening is also exposed to the gaseous mixture comprising fluorine. But contrary to the side walls, at the bottom side of the openings fluorination is prevented or at least the effect of the fluorination is nullified by the ion bombardment. Plasma etching includes plasma-assisted dry etching as well as reactive ion etching (RIE). The plasma etching of the organic-containing insulating layer can be performed using a patterned bilayer as an etch mask, said bilayer comprising a resist hard mask layer, being formed on said organic-containing insulating layer, and a resist layer being formed on said hard mask layer. Particularly, said resist hard mask layer can be a silicon oxide, or a silicon nitride, or a silicon oxynitride, or a silicon carbide, or a silicon oxycarbide. By doing so a highly anisotropic plasma etch is performed featuring substantially no undercut of the resist hard mask layer and with the conservation of the original resist hard mask profile.

The pressure in the reaction chamber is typically between 1 mTorr and 100 mTorr, or between 1 mTorr and 300 mTorr, or between 1 mTorr and 5 Torr. The setting temperature is typically between −10° C. and 50° C., −30° C. and 50° C., or −60° C. and 70° C. This setting temperature is the temperature as set on the heating/cooling source. The actual temperature in the reaction chamber can be higher dependent on the plasma conditions. Typical examples of fluorine-containing gases are $SF_6$, or $NF_3$, or $C_2F_6$, or $CF_4$ or $CHF_3$ or $CH_3F$ or $CH_2F_2$ or mixtures thereof. The inert gas can be helium or argon or krypton or nitrogen or xenon or krypton. The inert gas is preferably nitrogen. More preferably, the ratio of the amount of nitrogen in said gaseous mixture to the amount of fluorine-containing gas in said gaseous mixture is larger than 2:1.

In case the opening is a via hole, the plasma etching is performed until the surface of an underlying conductive layer or an underlying barrier layer is reached while preventing excess removal of the underlying layer. This underlying conductive and/or barrier layer can be a layer of Ti, TiN, Ta, TaN, Co, silicon nitride, silicon carbide, silicon oxycarbide, Pt, W, Al, Cu or an alloy of Al or Cu, or any other low resistivity material.

As an example, an anisotropic plasma etch process to create openings in a BCB layer is disclosed.

Experimental conditions are:

etch tool: high density plasma reactor (TCP 9400)
gaseous mixture for the plasma etch: $SF_6$ and $N_2$
etch conditions in chamber: 15 mTorr
TCP power: 700 watt
bottom power: 100 watt
hard mask layer is a PECVD oxide layer with a thickness of 250 nm
thickness of the resist layer (Sumitomo I-line resist): 1.2 $\mu$m
thickness of BCB layer: 0.7 $\mu$m
underlying layer: TiN layer
set-point temperature: 20° C.

Figure 5:
FIG. 5 represents a SEM picture of the via holes in an organic-containing insulating layer (7), i.e. a BCB layer, after plasma etching according to a preferred embodiment in an ambient comprising $SF_6$ and $N_2$. The picture shows a $SiO_2$ layer (8), remaining resist (9), intact Ti/TiN barrier layer (6) on a conductive AlSiCu layer (5). Layer (4) is again a Ti/TiN barrier layer. No undercut of the $SiO_2$ layer can be detected.

Under these conditions the BCB layer was etched with an etch rate of 500 nm/min, yielding a highly anisotropic etch profile and substantially no hard mask undercut (FIG. 5). Furthermore the resist hard mask profile was kept intact and there was substantially no TiN loss. When reaching the surface of the TiN layer the thickness of the remaining resist left-overs was about 0.1 μm. These resist left-overs can be removed by a subsequent etching step without attacking the other materials present on the wafer, particularly the BCB. Then, eventually, a cleaning step can be performed using diluted $H_2SO_4$ to remove the residues without attacking the other materials present on the wafer. Alternatively, instead of $H_2SO_4$, EKC 265 or a combination of $H_2SO_4$ and EKC 265 can be used.

With this etch chemistry, resist hard mask undercut is prevented due to the fluorination of at least a part of the BCB layer. This fluorination is obtained by exposure of the side walls of the BCB layer to an ambient comprising fluorine. Said fluorination increases the chemical and mechanical resistance of said BCB as clearly supported by FIGS. 1, 2, and 3.

Figure 2:
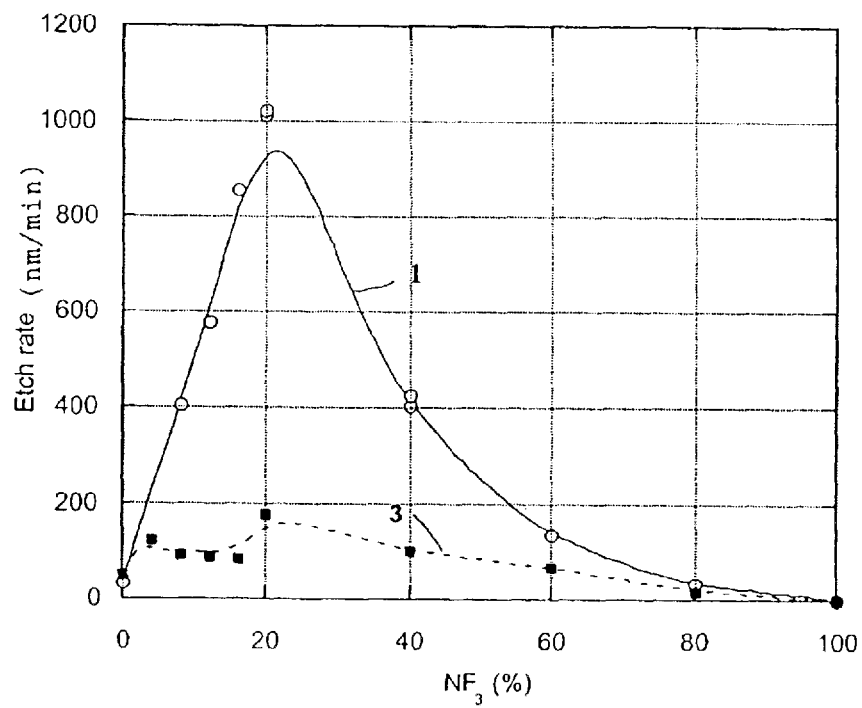
FIG. 2 represents, according to a preferred embodiment, the etch rate of BCB (Cyclotene 5021™) in a plasma ambient comprising a mixture of $NF_3$, $O_2$ and He versus the percentage of $NF_3$. The total gas flow was 115 sccm, whereas the pressure in the chamber was 1.30 Torr. The He flow was kept constant and equal to 65 sccm. The flows of $NF_3$ and $O_2$ were chosen complementary and were varied between 0 and 50 sccm, whereby the sum of the $NF_3$ flow and the $O_2$ flow was kept constant and equal to 50 sccm. The percentage of $NF_3$ in the figure is the relative amount of $NF_3$ compared to the amount of $NF_3$ and $O_2$ without taking into account He.
Figure 3:
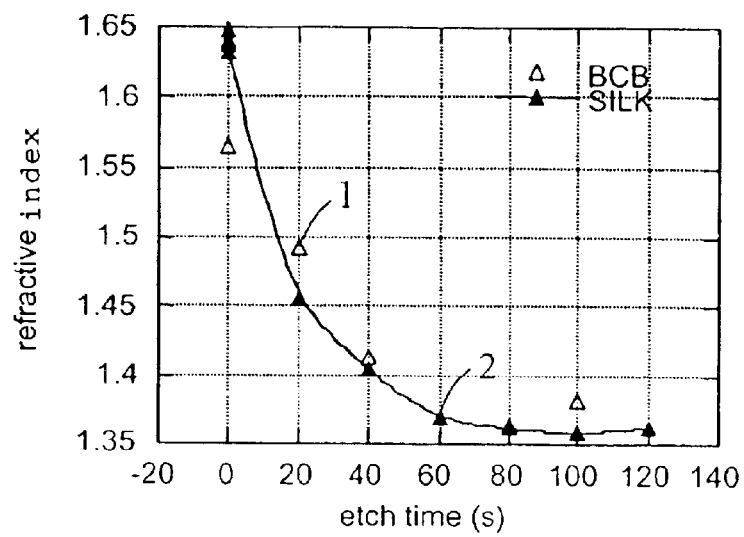
FIG. 3 represents the change in refractive index of SiLK and BCB as a function of etch time in a $NF_3$ afterglow plasma.
Figure 4:
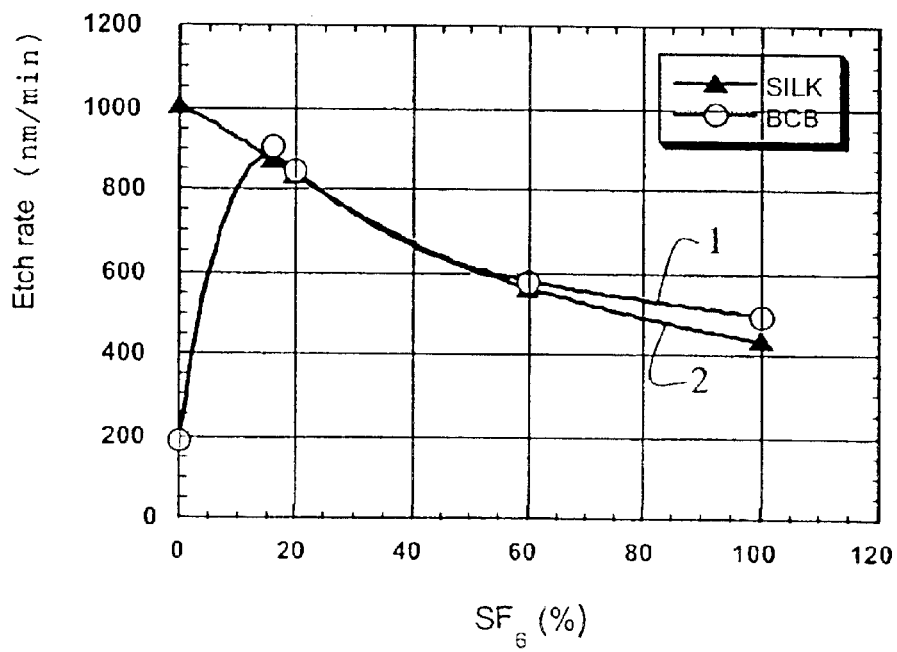
FIG. 4 represents etch rates of SiLK and BCB in RIE conditions with changing $SF_6/O_2$ gas flow ratios (0=pure $O_2$ diluted in $N_2$, 100=pure $SF_6$ diluted in $N_2$).

FIG. 1 shows the etch rate of a planar BCB layer (1) and a SILK layer (2) under afterglow conditions, i.e. without ion bombardment, in a gaseous mixture comprising a fluorine-containing gas, being $NF_3$, and an oxygen-containing gas, being $O_2$. It is observed that the etch rate in pure fluorine-containing plasma is substantially zero. It is also observed that this exposure affects only a part of the layer, said part starting at the exposed surface of the layer and extending into the layer. The thickness of said fluorinated part of the film depends on the atomic fluorine concentration, the fluorination time, i.e. the exposure time, and the temperature. This observation confirms the expectations because the fluorination is a diffusion-limited process. The fluorination of said part of the BCB layer, leads to a change of refractive index and chemical composition of said fluorinated part of the BCB layer. This is also observed for SILK films and Flare-II films. As depicted in FIG. 2, the etch rate for etching a fluorinated BCB film (3) in a $O_2/NF_3$ afterglow plasma can be substantially lower than the etch rate for etching pristine BCB films (1), dependent on the $O_2/NF_3$ ratio. The change of the refractive index (FIG. 3) is also indicative for the fluorination of the BCB layer under pure $NF_3$ afterglow conditions. Lowering of the refractive index results in a lowering of the K-value. From these observations in an afterglow plasma, one can conclude that lateral etching in a plasma etch process, e.g. RIE, can be controlled by the choice of the right process chemistry. The vertical etch rate however will be higher in RIE as compared to afterglow because energy is still provided to the surface by means of ion bombardment. The vertical etch rates obtained in RIE for $SF_6/N_2$ chemistries are shown in FIG. 4. From the figures, one can conclude that working under oxygen free etch conditions allows sufficient etch rate (vertical) with substantially zero etch rate in the lateral direction.

Figure 7:
FIG. 7 represents a SEM picture of trenches in an organic-containing insulating layer (7), i.e. a SILK layer, after plasma etching according to a preferred embodiment in an ambient comprising $N_2$ and $O_2$ at a ratio of 5:1, showing intact $SiO_2$ layer (8). No undercut of the $SiO_2$ layer can be detected.

In a second aspect of a preferred embodiment, a method is disclosed for forming at least one opening in an organic-containing insulating layer formed on a substrate. These openings are created by plasma etching said insulating layer in a reaction chamber containing a gaseous mixture, said gaseous mixture comprising an oxygen-containing gas and an inert gas. Preferably, this organic-containing insulating layer is a low K polymer layer. Particularly, this organic-containing insulating layer can be a silicon-free polymer layer. Typical examples are poly arylene ether, i.e. FLARE™ II, aromatic hydrocarbon, i.e. SILK™. To obtain anisotropic plasma etching, preferably the spontaneous etching is limited or negligible, while the etch reaction is effectively stimulated by ion bombardment. In other words, the lateral etch rate should be negligible small compared to the vertical etch rate. As can be deduced from FIG. 1 the spontaneous etch rate of a planar SILK layer (2) and a planar BCB layer (1) under afterglow conditions, i.e. without ion bombardment, in a pure oxygen ambient is, although below 100 nm per minute, far too high making such a pure oxygen ambient unsuited for anisotropic plasma etching. However, by introducing an appropriate amount of an inert gas the spontaneous etching rate can be reduced to substantially zero. The plasma etching of the organic-containing insulating layer, according to a preferred embodiment, can be performed using a patterned bilayer as an etch mask, said bilayer comprising a hard mask layer, being formed on said organic-containing insulating layer, and a resist layer being formed on said hard mask layer. The plasma etching method has a high selectivity to the hard mask layer formed on the polymer layer. Particularly, said hard mask layer can be a silicon oxide, or a silicon nitride, or a silicon oxynitride, or a silicon carbon, or a silicon oxycarbon layer. The plasma etch process creates openings in the organic-containing insulating layer and simultaneously removes the resist layer thereby avoiding a resist strip after etching By doing so a highly anisotropic plasma etch is performed featuring substantially no undercut of the hard mask layer, selective to the hard mask layer and with the conservation of the original hard mask profile. Preferably (FIG. 7), the side walls of the openings are slightly positively sloped yielding a better performance and reliability in the subsequent processing steps, e.g. filling the opening with a metal.

The pressure in the reaction chamber is typically between 1 mTorr and 100 mTorr, or between 1 mTorr and 300 mTorr, or between 1 mTorr and 5 Torr. The setting temperature is typically between −10° C. and 50° C., −30° C. and 50° C., or −60° C. and 70° C. This setting temperature is the temperature as set on the heating/cooling source. The actual temperature in the reaction chamber can be higher dependent on the plasma conditions. Preferably the oxygen-containing gas is $O_2$ but the preferred embodiments are not limited thereto. The inert gas can be helium or argon or krypton or xenon or nitrogen. The inert gas is preferably nitrogen. More preferably, the ratio of the amount of nitrogen in said gaseous mixture to the amount of oxygen in said gaseous mixture is in the range from 10:1 to 2:1 or from 30:1 to 1:1.

In case the opening is a via hole, the plasma etching is performed until the surface of the underlying conductive layer or the underlying barrier layer is reached while preventing excess removal of the underlying layer. This underlying conductive and/or barrier layer can be a layer of Ti, TiN, Ta, TaN, Co, silicon nitride, silicon carbide, silicon oxycarbide, Pt, W, Al, Cu or an alloy of Al or Cu, or any other low resistivity material.

In a preferred embodiment, as an experimental example, an anisotropic etch process on a silicon-free polymer layer, i.e. a SILK layer is disclosed.

Experimental conditions are:

etch tool: high density plasma reactor (TCP 9100)
gaseous mixture for the plasma etch: $O_2$ and $N_2$
etch conditions in chamber: 5 mTorr
TCP power: 400 watt
bottom power: 200 watt
hard mask layer is a PECVD oxide layer with a thickness of 250 nm
thickness of the resist layer (Sumitomo I-line): 1.2 μm
thickness of SILK layer: 1.1 μm underlying layer: TiN layer
set-point temperature: 20° C.

Figure 6:
FIG. 6 represents a SEM picture of via holes in an organic-containing insulating layer (7), i.e. a SILK layer, after plasma etching according to a preferred embodiment in an ambient comprising $O_2$ and $N_2$, showing intact $SiO_2$ layer (8), intact Ti/TiN barrier layer (6) on a conductive AlSiCu layer (5). No undercut of the $SiO_2$ layer can be detected.

Under these conditions the SILK layer was etched with an etch rate of 500 nm/min, yielding via holes (FIG. 6) with a highly anisotropic etch profile and substantially no hard mask undercut. Furthermore the hard mask profile was kept intact and there was substantially no TiN loss. When reaching the surface of the TiN layer the resist layer was totally removed. Then a cleaning step was performed using diluted $H_2SO_4$ to remove the residues without attacking the other materials present on the wafer. Alternatively, instead of $H_2SO_4$, EKC 265 or a combination of $H_2SO_4$ and EKC 265 or an SPM solution can be used.

Figure 8:
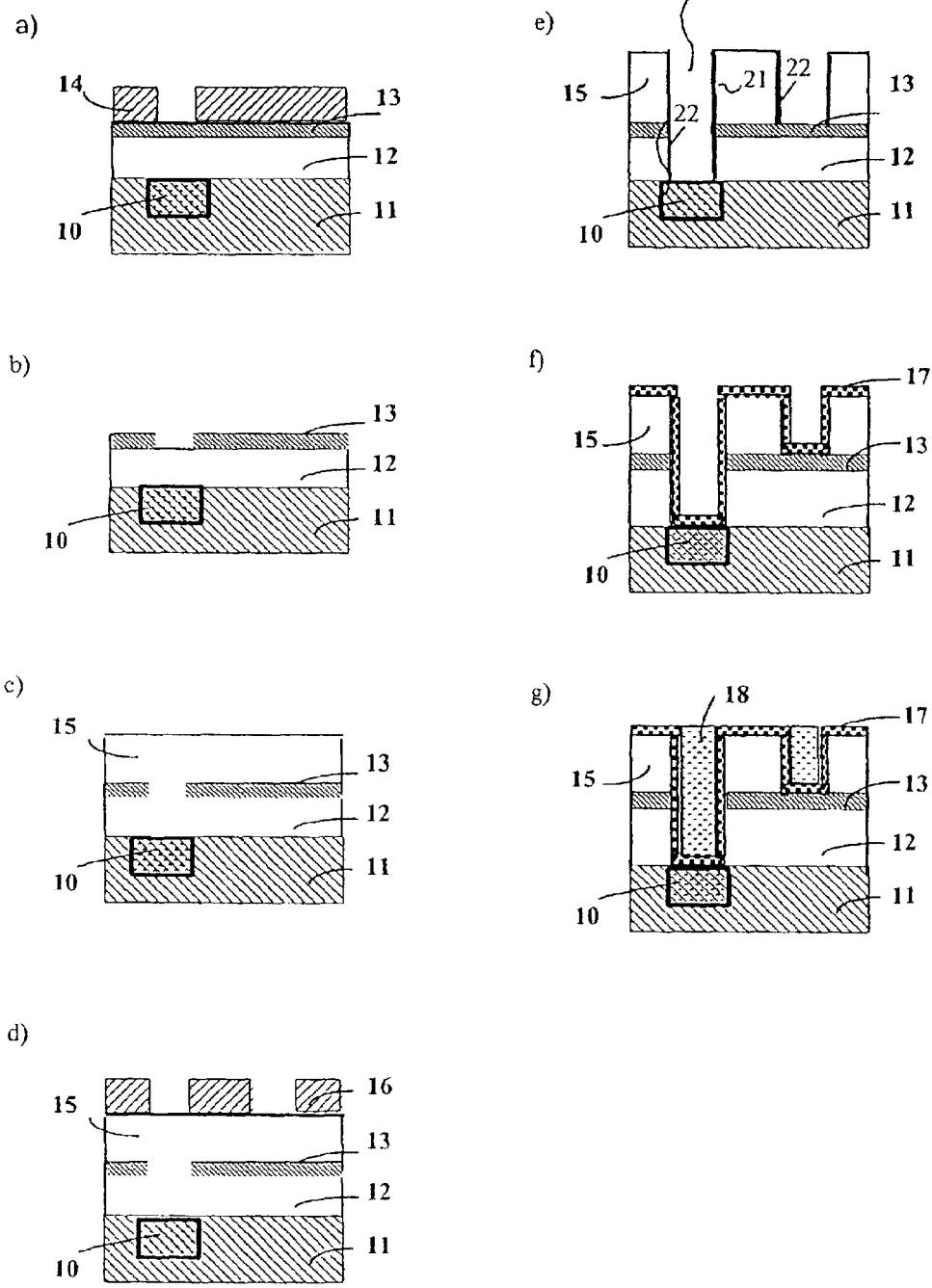
FIG. 8 represents, according to a preferred embodiment, a detailed description of the processing steps involved to create a particular interconnect structure, i.e. a dual-damascene structure.
Figure 9:
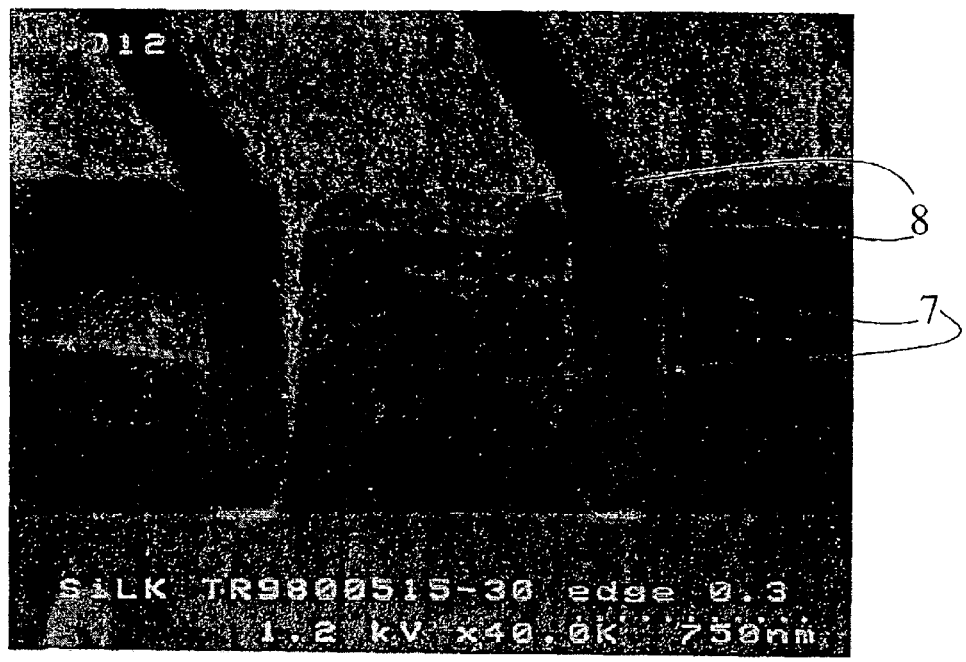
FIG. 9 represents a SEM picture of trenches in an organic-containing insulating layer (7), i.e. a SILK layer, after a two-step plasma etching according to a preferred embodiment, showing intact $SiO_2$ layer (8). No undercut of the $SiO_2$ layer can be detected.

In a second embodiment, prior to the step of anisotropic plasma etching of an organic-containing insulating layer in an ambient comprising an oxygen-containing gas and an inert gas, a first part of an opening is created in said organic-containing insulating layer by plasma etching in an ambient comprising a fluorine-containing gas and an inert gas. In fact a two-step anisotropic etch process is disclosed (as in FIG. 9) wherein in a first step a first part of an opening is created by means of anisotropic plasma etching using a gaseous mixture comprising a fluorine-containing gas and an inert gas, while in a second step the second part of said opening is etched by means of anisotropic plasma etching using a gaseous mixture comprising an oxygen-containing gas and an inert gas to thereby complete said opening and simultaneously selectively remove the resist. The openings formed by this two-step etch process have slightly positively sloped side walls. As an example (FIG. 8), a particular dual-damascene structure is described. During the fabrication of such a structure the method of the preferred embodiments is utilized. It should be clear however that the preferred embodiments are not limited to this particular structure but the preferred embodiments can be applied for any isolation or interconnect structure comprising organic-containing insulating layers wherein openings have to be created. According to the example (FIG. 8).

A first dielectric layer (12), i.e. an organic polymer layer comprising phenyl groups is formed on a substrate (11) comprising a patterned conductive layer (10). Said conductive layer can be a single conductive layer or a combination of a conductive layer and a barrier layer. Examples of such polymers are the benzocyclobutarenes, i.e. benzocyclobutene (BCB) commercially available as Cyclotene 5021™, poly arylene ether, i.e. FLARE™ II, aromatic hydrocarbon, i.e. SILK™, polyimides.

A first hard mask layer (13), e.g. a silicon oxide or a silicon nitride or a silicon oxynitride layer or a SiC layer, is formed on this organic polymer film. Then a patterned resist layer (14) is formed thereon (FIG. 8, step a)). Further, said first hard mask layer is patterned (FIG. 6, step b)) using said patterned resist layer as a mask and said second resist layer is removed.

A second dielectric layer, i.e. an organic-containing insulating layer comprising at least one phenyl group (15), is formed (step c)) on the patterned first hard mask layer. A patterned bilayer (16) is formed (step d)) on said second dielectric layer. This bilayer comprises a second hard mask layer, being formed on said second dielectric layer, and a second resist layer being formed on said second hard mask layer.

The first and the second dielectric layer can be etched by means of the anisotropic plasma etching method of the preferred embodiments. There are at least two possibilities.

As a first possibility, a first part of the openings can be formed by plasma etching said second dielectric layer in a gaseous mixture comprising a fluorine containing gas and an inert gas using the patterned bilayer as an etch mask which can result in the formation of a first part of a trench and a first part of a via hole. In such case, the first hard mask layer not necessarily functions as an etch stop layer. The thickness of the second resist layer is chosen in accordance with the etch time such that when this first timed etch is stopped there is still some resist left and said first hard mask layer is not yet reached. Thereafter the etch in said second dielectric layer is continued by plasma etching in a gaseous mixture comprising an oxygen-containing gas and an inert gas. This second etch is selective to said first and said second hard mask layer thereby preventing the extension from the trench in the first dielectric layer (step e)). The first dielectric layer is then etched in a gaseous mixture comprising an oxygen-containing gas and an inert gas using the patterned first hard mask layer as a mask to form a via hole i.e. exposing the surface of the underlying conductive layer (step e)).

As a second possibility, the openings can be formed by plasma etching said second dielectric layer in a gaseous mixture comprising an oxygen-containing gas and an inert gas using the patterned bilayer as an etch mask. This etch is selective to said first and said second hard mask layer thereby preventing the extension from the trench in the first dielectric layer (step e)). The first dielectric layer is then etched in a gaseous mixture comprising an oxygen-containing gas and an inert gas using the patterned first hard mask layer as a mask to form a via hole i.e. exposing the surface of the underlying conductive layer (step e)). The etching of the first and second dielectric layer can be performed using a single etch step or two subsequent etch steps.

Both possibilities have the common advantage that the second resist layer is completely and selectively removed.

Thereafter said second hard mask layer can be removed (as in FIG. 8, step e)) or not.

A conductive layer, e.g. an alloy of or pure Al, Cu, Ag, Pt, Co, Ti, Ni or Au, or a combination of a conductive layer (18) and a barrier layer (17), like e.g. a Ti-containing layer or a Co-containing or a Ni-containing layer or a Ta-containing layer, can be deposited (FIG. 8, steps f) and g)) thereby filling the via hole in the first and second dielectric layer and the trench in the second dielectric layer.

In a third embodiment of the second aspect, a method is disclosed for sealing the exposed surfaces at least one opening formed in an organic-containing insulating layer formed on a substrate. Such organic-containing insulating layer can be a low-K dielectric.

FIG. 8a)–g) shows the sequence of creating an opening in a dielectric layer. This dielectric layer is part of a damascene dielectric stack formed on a semiconductor stack. This semiconductor substrate can be any substrate used in semiconductor industry such as silicon wafers. The substrate can further comprise active devices such as transistors or passive devices such as capacitors and resistors. The substrate can further comprise patterned layers of dielectrics and conductive materials (10) to form an interconnect structure. In FIG. 8e) the etch plasma (not shown) creates an opening in the dielectric stack (15,13,12). In prior art applications such as EP 1 037 275 the top surface of the low-k dielectric is being exposed to a plasma. The application EP 1 037 275 discloses a method for forming a porous silicon oxide film by exposing a polymer film comprising Si and C to an oxidizing plasma. This oxidizing plasma changes the porosity of the as-deposited uniform layer and hence the dielectric constant of this layer. The prior art etch plasma changes the K-value of the low-k dielectric all over the wafer. In FIG. 8e) for example only the sidewalls (20) of the opening (21) are in direct contact with the etch or strip plasma. The top surface of the low-k dielectric (15) is being protected and insulated from the chemicals (3) by the top hard mask (part of 16) which is resistant to the chemicals applied. This top hard mask layer is known in damascene technology. This top hard mask layer can comprise silicon or nitride, carbide and oxide, e.g. SiO2, SI3N4, SiC, SiOC. Thanks to this protective layer only the exposed surfaces (21) of the openings (22) are subject to the etch or strip plasma, resulting in a local change of the dielectric constant. The porosity of the sidewalls (21) can be modified by this etch or strip plasma.

Although the dielectric constant can be locally decreased during the step of creating the opening subsequent processing might a negative impact on the local k value. Although the top surface of the dielectric layer (15) can be protected by a hard mask (part of bilayer 16) the openings (20) formed in the hard mask and in the dielectric layers (15,12) underneath the hard mask to receive the barrier (17) and conductive layers (18) make the lowk dielectric susceptible to further processing. These openings give access to the low-k dielectric and the surface of the low-k dielectric remains exposed and hence unprotected. In the paper "Critical issues in the integration of Copper and low-k dielectrics, by R. A. Donaton et al., proceedings of the IEEE 1999 International Interconnect Technology Conference" results are shown of interline capacitance measurements with two different cleaning solutions. As can be seen, the negative impact of the cleaning solution that is used can be high. It is to be expected that the problem of cleaning of porous materials will even be much more difficult, but also for the non-porous low-k materials, the danger of low-k material modification in the cleaning step is clear and present. A reason for this degradation might be that the low-k dielectric is affected by residues or other materials used or present during further processing. The preferred embodiments therefore discloses a method for preserving the K-value of the low-K dielectric by sealing off the exposed surfaces of the dielectric layers. The sealing results from the formation of a layer (22) at least on these sidewalls (21). This protective or sealing layer (20) can be formed after the step of patterning the opening and stripping the resist layer (14,16). This protective layer (22) can be formed during the step of creating the opening (20). This protective layer (22) can be formed during the step of removing the resist layer (14,16). The protective layer can be formed using a plasma comprising oxygen and nitrogen.

In a third preferred embodiment of the second aspect, the preservation of a locally modified TriMethylSilane (TMS)-$O_3$ low-k film is discussed.

Film Deposition

Deposition of the TMS-$O_3$ based low-k dielectric was done in a sub-Atmospheric Chemical Vapor Deposition (SACVD) CxZ chamber of Applied Materials, a United States-based company.

Film Structure

Figure 10:
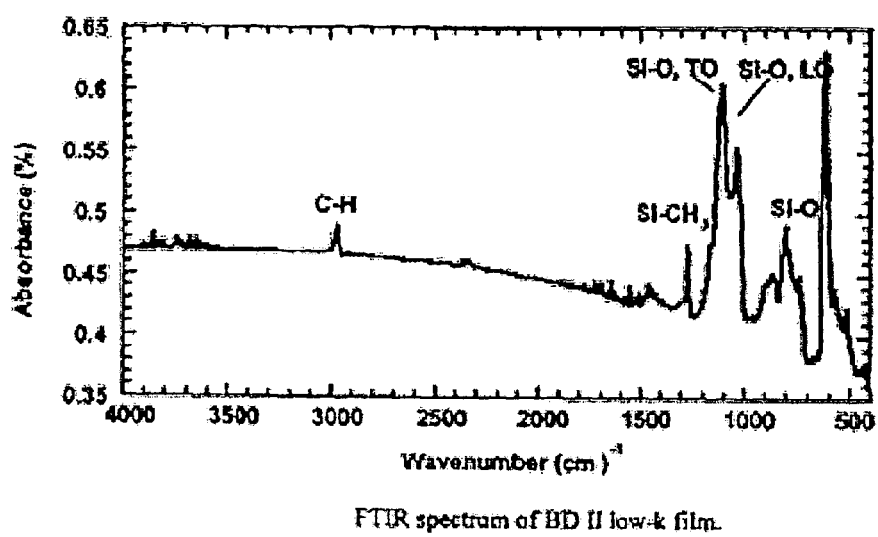
FIG. 10 represents an FTIR spectrum of a Black Diamond™ low-K film

The film structure is investigated by Fourier Transform infrared spectroscopy (FTIR) and a typical spectrum of the film is given in FIG. 10. The main features in this spectrum are the strong absorption peaks due the presence of the Si—O bonds and the presence of C—H and Si—$CH_3$ bonds. The film has a stress value of $6 \times 10^8$ dynes/$cm^2$ (60 MPa) and this value is the same after thermal cycling up to 500° C. The film is stable to temperatures up to 550° C., as found by thermal desorption spectroscopy (TDS) analysis.

Single Damascene Integration

Figure 11:
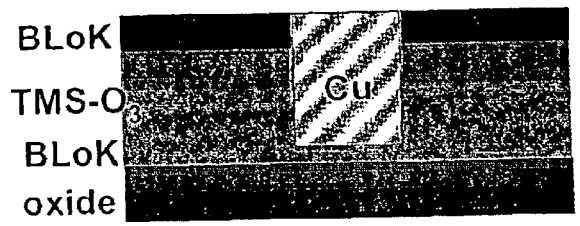
FIG. 11 represents a schematic drawing of the dielectric stack used in the etch/strip development and single damascene integration, according to a second aspect of a preferred embodiment.

The single-damascene stack consists of (from Si substrate) 50 nm SiN/500 nm SiO2/50 nm BloK/500 nm TMS-$O_3$/100 nm BloK as shown in FIG. 11. BloK™ stands for Buried Low-k material and comprises SiC. The etchings have been performed in a LAM 4520XL tool. Results are presented for tests on patterned wafers. Also, a limited number of strip experiments has been conducted. It is important to mention that the lithography process was target to 0.25 µm dimensions.

First the hardmask (HM)-opening of the 100 nm SiC layer is performed using a slightly modified recipe that is standardly used in oxide damascene etching. This Ar/$N_2$/$CF_4$/$O_2$ recipe yields very straight (remaining) resist and SiC profiles, and sufficient resist selectivity, as about 250 nm of resist is left in between dense trenches for the standard process. The disadvantage however, lies in the sidewall roughness which is generated by this process, and which is only visible in top-down inspection.

Figure 12:
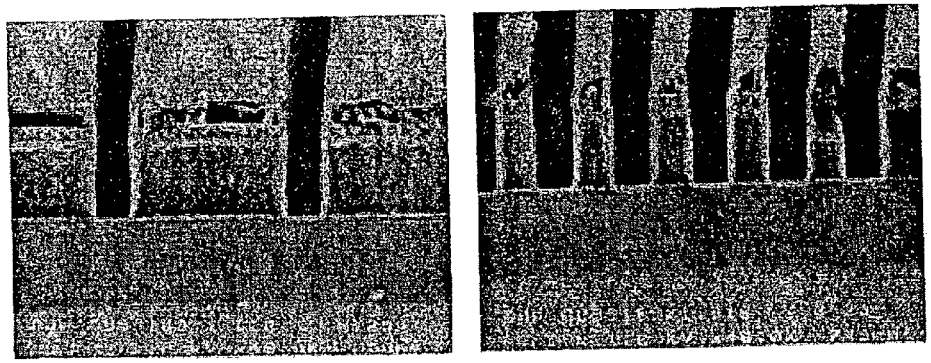
FIG. 12 represents a cross-sectional SEM of isolated (left) and dense (right) 0.25 μm trenches etched on 500 nm TMS-$O_3$ low-k with 100 nm BLoK™ hard mask, according to a second aspect of a preferred embodiment.

After the opening of the hardmask, an opening is etched in the low-k layer using Ar/$CF_4$/$CHF_3$/$O_2$. This combination of hard mask and low-k etch chemistries yielded good results: there was still resist left (80 nm in between the dense 0.25 µm trenches), which was only slightly sloped. A good uniformity was observed for dense and isolated features. The bottom sizes are on target, while there is little CD gain to be seen for the trench top sizes. From the etch development it is observed that reducing the $O_2$ flow in the low-k etch step slightly improves the dense/isolated uniformity but makes the profiles more sloped. More resist remains on the wafer but on the other hand the low-k etch-rate decreases considerably. Also, the top and bottom trench widths become slightly smaller (20 to 30 nm). Overall, a good profile is obtained after etch for dense and isolated trenches. FIG. 12 shows cross-section SEM images of isolated and dense 0.25 µm trenches after etching.

It is known that resist removal process is a critical step in the patterning of Si—O—C type materials, since these films are very sensitive to oxygen plasma processes. Several resist stripping recipes were selected and tested.

Figure 13:
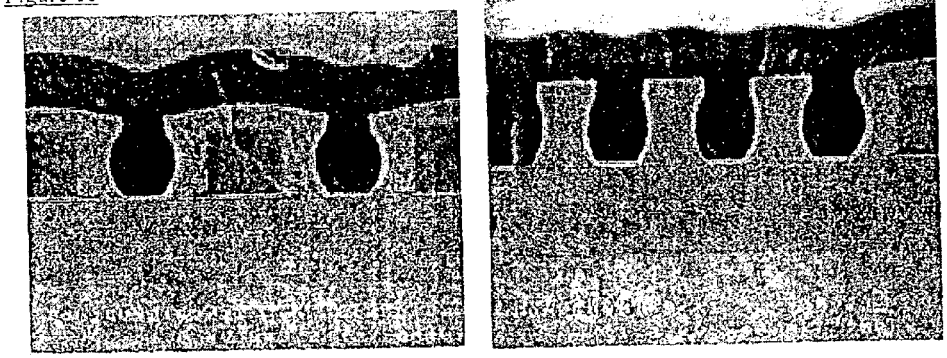
FIG. 13 represents 0.25 μm isolated (left) and dense (right) trenches after stripping in a high pressure and high temperature oxygen plasma, according to a second aspect of a preferred embodiment.

The results for the wafer that was subjected to a "standard" $O_2$ ashing, being carried out in a standard Inductively Coupled Plasma (ICP) chamber of an ASPEN system offered by Mattson, a United States-based company, at high pressure and high temperature, are presented in FIG. 13. There is severe shrinkage and bowing of the low-k film to be observed. The bowing is especially apparent for the (semi-) isolated trenches. Also, upon closer inspection of the SEM pictures it becomes clear that the structure of low-k material has changed for about 250 nm, measuring sideways from the sidewalls into the bulk of the low-k material.

Figure 14:
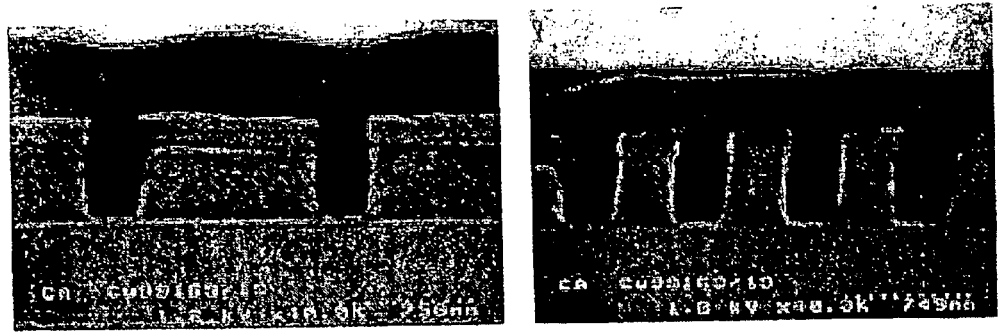
FIG. 14 represents 0.25 μm isolated (left) and dense (right) trenches after stripping in a $H_2O/CF_4$ plasma at low temperature and slightly lower pressure.

The strip results look much better for the $H_2O$-vapor strip, with some $CF_4$ addition, also carried out in the Mattson ICP Selectable Mode chamber at the same temperature and pressure conditions as the second strip process (i.e. lower temperature and slightly lower pressure). Limited undercut/bowing is visible, but the chance that these trenches will be filled with Cu is considerably larger than for the previous strips sequences. FIG. 14 shows cross section SEM images of isolated and dense trenches after stripping with this process.

Figure 15:
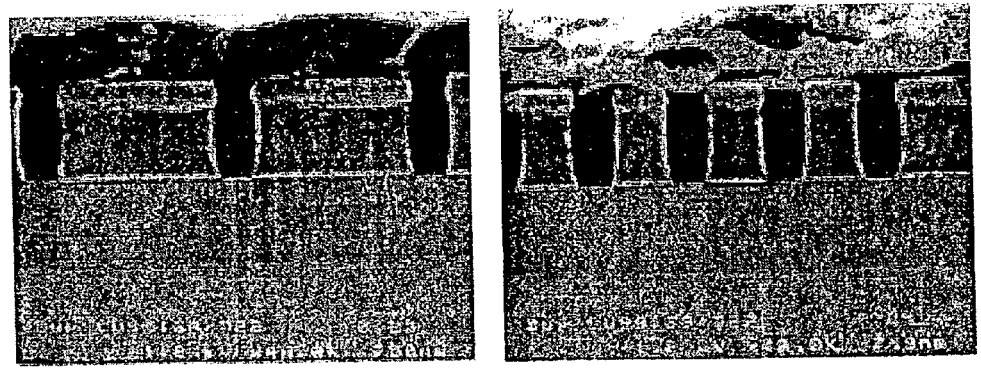
FIG. 15 represents 0.25 μm isolated (left) and dense (right) trenches after stripping in a $N_2/O_2$ plasma, according to a second aspect of a preferred embodiment.

Finally, another promising strip—from a cross-section point-of-view—seems to be a N2/O2 strip in the Lam TCP9100 chamber (at low pressure and low temperature), based on LAM's Transformer Coupled Plasma™ technology, As can be concluded from the images in FIG. 15, slight bowing and undercut are observed as a result of this process. The fact that this is an RIE-type strip causing the top HM to be rounded. However, no CD gain is observed and it is believed that this rounding will be beneficial towards Cu-fill. CD stands for critical dimension and is used to identify the feature dimensions under investigation. In case of an opening this CD is the width of the opening and the variation of this width along the depth of the opening.

Interline Capacitance

From the results obtained in the etch/strip development, one etch process and two stripping processes were chosen to pattern the wafers for integration into single damascene structures. The etching process consisted of a first step using Ar/N2/CF4/O2 for hard mask opening followed by Ar/CF$_4$/CHF$_3$/O$_2$ for etching of the low-k material. Low temperature and low pressure N$_2$/O$_2$ strip and the water-vapor processes were used as splits in the wafer processing.

The metallization scheme consisted of deposition of Physical Vapor Deposition (PVD) TaN barrier followed by PVD Cu seed layer deposition, done in the Applied Materials Electra-tool. The trenches were then electroplated filled in a Semitool ElectroChemicalDeposition (ECD) chamber. Chemical Mechanical Polishing was performed in an IPEC 676 tool. The conditions of these processes were kept constant.

Interline capacitance structures consisting of long parallel lines with spacing varying from 0.4 down to 0.2 mm were measured. 16 chips per wafer were manually measured (a column from north to south and a row from east to west). After measurements, the wafers were sent for cross-section FIB and later SEM analysis, in order to determine the real profile of the structures (trench and spacing dimensions, hard mask and trench thicknesses) electrically measured. The correct dimensions were used in the simulations performed for estimation of the dielectric constant of the TMS-O$_3$ material after full integration into single damascene structures. The TMA Raphael software package was used in the simulations. FIGS. 16–17 show the interline capacitance as a function of actual spacing between the lines, as extracted from the FIB and SEM cross-section images. In the graphs, the measured value (solid circles) is plotted together with the simulation results for different k values of the low-k material (from 2.2 up to 2.8). The dielectric constant values of the other materials used in the simulations were 4.3 for SiO$_2$ and SiC and 8 for SiN.

From the cross-section images, it is clear that the water vapor strip resulted in a much narrower spacing then the N$_2$/O$_2$ strip split. As previously shown in the etch/strip section, this strip results in much more trench undercut and bowing then the other strip process. The N$_2$/O$_2$ strip shows a better performance with respect to bowing/undercut. This is corroborated by the quality of the filling process, which is not significantly affected by that in the case of the N$_2$/O$_2$ strip process.

Looking at the capacitance vs. line spacing plots it is striking the fact that the measured values are close to or below the simulated values for a k=2.2. A dielectric constant value of 2.2 is very low for a Si—O—C type material. An error of approximately 10% has to be taken into account due to the uncertainties of the different parameters used in the simulation. Still, the value measured is considered considerably low. The N$_2$/O$_2$ shows a lower k value, resulting from the fact the modified K-value is being preserved thanks to the N$_2$/O$_2$ plasma and is not affected by subsequent processing such as the deposition of the barrier (17) and conductive layers (18). The water vapor strip resulted in significantly higher k value, when compared to the other stripping processes. The water vapor strip resulted in a significantly higher K value when compared to the N$_2$/O$_2$ strip.

It is important to mention that only the side wall of the trenches were exposed to the plasma during the ashing process, since a hard mask was always present on the surface, therefore avoiding direct exposure of the low-k film to the plasma. It is also important to mention that the values shown in the graphs correspond to one chip on the wafer, the chip that was used for cross section FIB and SEM.

In a third aspect, a method is disclosed for forming at least one opening in an organic-containing insulating layer formed on a substrate. These openings are created by plasma etching said insulating layer in a reaction chamber containing a gaseous mixture, said gaseous mixture comprising HBr and an additive, said additive passivating the exposed parts of the insulating layer, i.e. the side walls. Typical examples of such an additive are an inert gas, like N$_2$, Ar, He, Xe, krypton or an oxygen containing gas, like O$_2$, CO, CO$_2$, N$_2$O, NO$_2$, SO$_2$, but the preferred embodiments are not limited thereto. In fact, a wide variety of additives can be used for increasing the etch rate and/or for additional side wall passivation possibly resulting in positively sloped profiles. In a preferred embodiment, said gaseous mixture can further comprise fluorine-containing gases in order to increase the etch rate while keeping the selectivities and profiles substantially unchanged by balancing the gas flows.

In another embodiment, said gaseous mixture can further comprise chlorine-containing gases in order to increase the etch rate while keeping the profiles substantially unchanged and allowing a slight decrease of the selectivities by balancing the gas flows.

The organic-containing insulating layer can be plasma etched using the combination of a patterned hard mask layer and a patterned resist layer as an etch mask by means of plasma etching. The organic-containing insulating layer can be a polymer layer, preferably having a low permittivity. Particularly also silicon-containing polymer layers can be used. The pressure in the chamber is typically between 1 mTorr and 50 mTorr or between 1 mTorr and 5 Torr. By doing so a highly anisotropic etch is performed featuring substantially no undercut of the hard mask layer, selective to the hard mask layer and with the conservation of the original hard mask profile. Furthermore, in case said opening is a via hole, this highly anisotropic etch is selective to the underlying conductive layer or barrier layer.

Particularly, towards the silicon-containing polymers, HBr will help in obtaining higher etch rates by generating SiBr etch products which can be volatilized by means of ion bombardment. At the same time, lateral etching will be substantially inhibited by the formation of Si$_x$Br$_y$O$_z$ passivation layers, x, y and z being positive whole numbers. Possibly also C can be incorporated in these passivation layers. These passivation layers are stable as long as there is no exposure to ion bombardment. Particularly, the side walls of the via holes and/or trenches are not exposed to such an ion bombardment. The plasma etch process will have a very high selectivity towards hard mask materials allowing the resist to be removed during the etch process with conservation of the hard mask thickness and profile. As a consequence, this process will allow much thinner hard masks to be used for the formation of via holes and/or trenches. Selectivity both to the hard mask layer and to the underlying conductive layer can be obtained by controlling the ion energy.

Towards the silicon-free polymers, this plasma etch process will allow improved profiles because of the limited lateral etch rate. This will allow high over-etch times whenever needed. The plasma etch process will have a very high selectivity towards hard mask materials allowing the resist layer to be removed during the etch process with conservation of the hard mask thickness and profile. As a consequence, this process will allow much thinner hard mask layers to be used for the formation of via holes and/or trenches. Selectivity both to hard mask layer and eventually to the underlying conductive layer can be obtained by controlling the ion energy.

What is claimed is:

1. A method for forming a sealing layer on surfaces of side walls of at least one opening in an organic-containing insulating layer comprising the step of:

creating said opening by plasma etching said organic-containing insulating layer in a reaction chamber containing a gaseous mixture, whereby a sealing layer is formed on surfaces of said side walls of said opening, said gaseous mixture comprising an oxygen-containing gas and an inert gas, said inert gas and said oxygen-containing gas being present in said gaseous mixture at a ratio at which spontaneous etching is negligible.

2. The method as recited in claim 1, wherein said organic-containing insulating layer is a low K organic polymer layer.

3. The method as recited in claim 1, wherein said plasma etching is performed using a patterned bilayer as a mask, said bilayer comprising a hard mask layer being formed on said organic-containing insulating layer, and a resist layer being formed on said hard mask layer.

4. The method as recited in claim 3, wherein said resist layer is selectively removed from said hard mask layer while creating said opening.

5. The method as recited in claim 1, wherein said oxygen-containing gas in said gaseous mixture is $O_2$ and said inert gas in said gaseous mixture is nitrogen.

6. The method as recited in claim 5, wherein said ratio of nitrogen in said gaseous mixture to oxygen in said gaseous mixture is in the range of from 5:1 to 2:1.

7. The method as recited in claim 1, wherein prior to plasma etching in said reaction chamber containing said gaseous mixture, said method further comprises:

creating a first part of said opening by plasma etching said insulating layer in said reaction chamber containing a first gaseous mixture, said first gaseous mixture comprising a fluorine-containing gas and an inert gas; and controlling said plasma etching in said reaction chamber containing said first gaseous mixture, while creating said first part of said opening, such that substantially no etch residues are deposited and that the side walls of said first part of said opening are fluorinated during said plasma etching to thereby enhance the anisotropy of said plasma etching in said reaction chamber containing said first gaseous mixture.

8. The method as recited in claim 7, wherein said opening has positively sloped side walls.

* * * * *